United States Patent
Chen et al.

(10) Patent No.: US 9,515,021 B1
(45) Date of Patent: Dec. 6, 2016

(54) SEMICONDUCTOR STRUCTURE AND METHOD OF FORMING THE SAME

(71) Applicant: TAIWAN SEMICONDUCTOR MANUFACTURING CO., LTD., Hsinchu (TW)

(72) Inventors: Yu-Chih Chen, Tainan (TW); Hung-Lung Hu, Tainan (TW); Chia-Ching Tsai, Tainan (TW); Szu-Hung Yang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/887,952

(22) Filed: Oct. 20, 2015

(51) Int. Cl.
| | | |
|---|---|---|
| *H01L 21/30* | (2006.01) | |
| *H01L 23/528* | (2006.01) | |
| *H01L 23/532* | (2006.01) | |
| *H01L 23/535* | (2006.01) | |
| *H01L 21/768* | (2006.01) | |
| *H01L 21/3115* | (2006.01) | |

(52) U.S. Cl.
CPC ......... *H01L 23/528* (2013.01); *H01L 21/3115* (2013.01); *H01L 21/76802* (2013.01); *H01L 21/76877* (2013.01); *H01L 23/535* (2013.01); *H01L 23/53214* (2013.01); *H01L 23/53228* (2013.01); *H01L 23/53242* (2013.01); *H01L 23/53257* (2013.01)

(58) Field of Classification Search
CPC ............. H01L 23/528; H01L 23/53214; H01L 23/53228; H01L 23/525; H01L 23/53242; H01L 23/76802; H01L 23/76877; H01L 23/3115
See application file for complete search history.

(56) References Cited

U.S. PATENT DOCUMENTS

| | | | | |
|---|---|---|---|---|
| 8,993,435 B2 * | 3/2015 | Wang | ............... | H01L 21/02126 257/751 |
| 2004/0214446 A1 * | 10/2004 | Kim | ..................... | C23C 16/401 438/706 |

OTHER PUBLICATIONS

"Pressureless Silver Sintering Die-Attach for SiC Power Devices" Université de Lyon et al., Trans Tech Publications, Switzerland, Materials Science Forum vols. 740-742 pp. 851-854, (2013).

* cited by examiner

*Primary Examiner* — Roy Potter
(74) *Attorney, Agent, or Firm* — Maschoff Brennan (57) ABSTRACT

A semiconductor device with metal-doped etch stop layer therein and a method of manufacturing the same is disclosed. The method includes forming an semiconductor device with a interconnect structure that has a dielectric layer and a conductor therein, and an etch stop layer over the dielectric layer; applying a photo resist layer and patterning the photo resist layer to expose a portion of the etch stop layer on a top surface of the conductor over of the dielectric layer; and doping the exposed portion of the etch stop layer with an element to form a metal-doped etch stop layer. The formed metal-doped etch stop layer has a recess structure and functions as a conductive pad over the conductor.

20 Claims, 10 Drawing Sheets

SEMICONDUCTOR STRUCTURE AND METHOD OF FORMING THE SAME

BACKGROUND

An integrated circuit includes two, three or more levels of conductors that extend across the topography of a monolithic substrate. A via is etched through the dielectric layer on the conductor that is in or on an underlying dielectric layer in the contact structure. Typically, an etch stop layer is applied over the underlying dielectric layer to assure the etching process stops on a etch stop layer. The via is filled with a conductive material to form a plug.

Inside the via from at a top surface of the conductor, an exposed portion of the etch stop layer is etched away so as to further expose the top surface of the conductor. In removing the etch stop layer over the conductor, the exposed top surface of the conductor, like a conductive metal, is apt to react with oxygen to form a porous metal oxide layer having a higher electric resistance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures.

Although the embodiment is described in the context of one or two elements or features such as, for example, a conductor and a via hole, it is also applicable to a plurality of elements or features. In reality, a semiconductor device comprises a plurality of such conductors and via holes. For simplicity, a plurality of repeated elements or features is described as one or two element or feature in the embodiments.

Figure 1A:
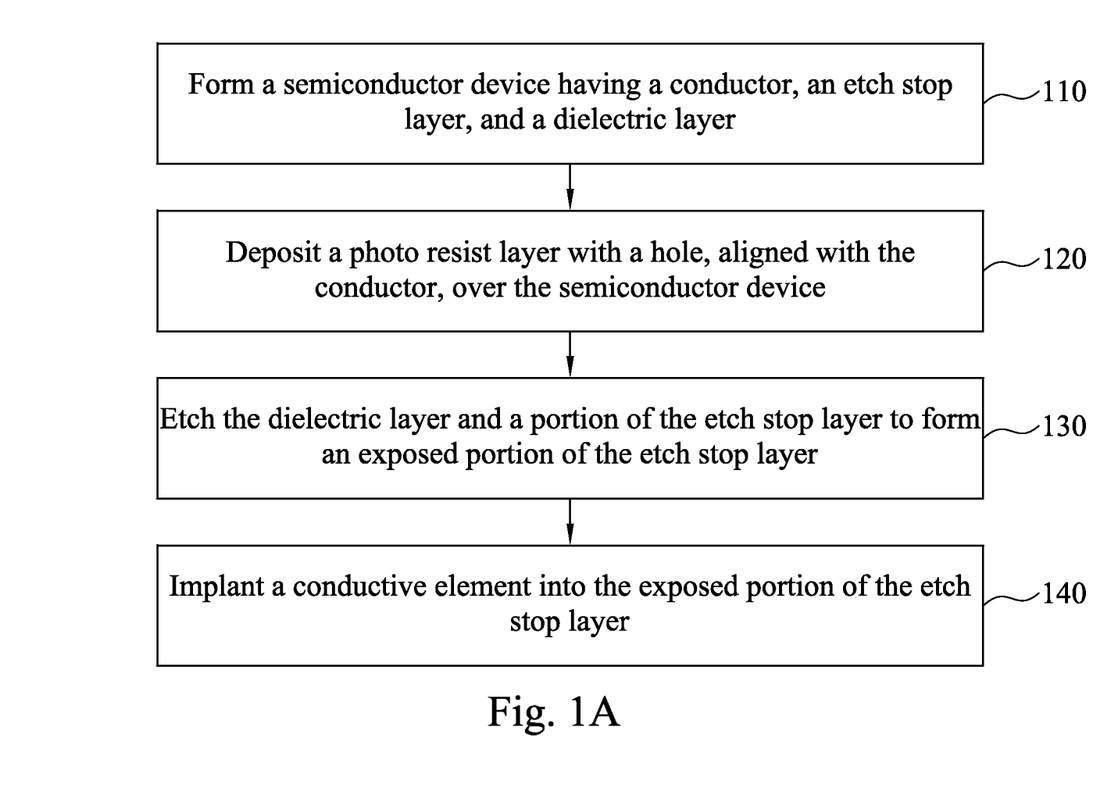
FIG. 1A and FIG. 1B illustrate flow charts of entire manufacturing processes and detailed processes of a first stage process separately, in accordance with the embodiments.
Figure 1B:
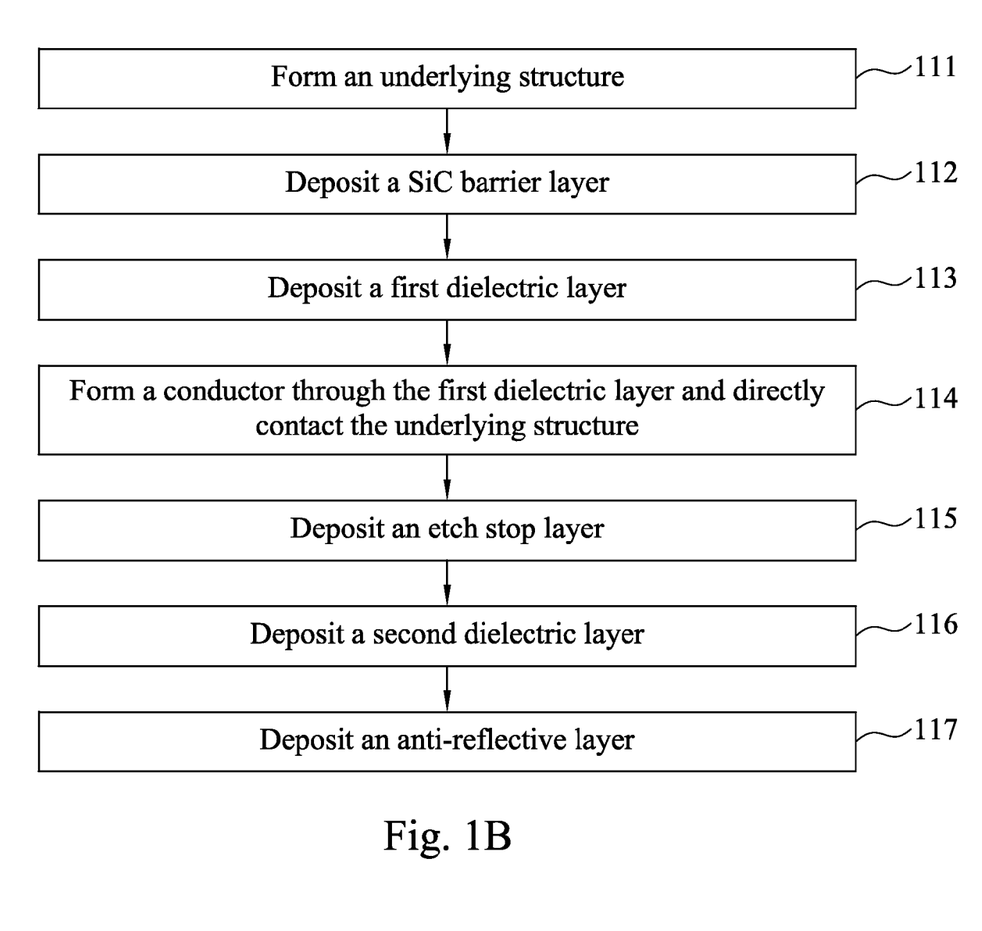

FIG. 1A illustrates flow charts of entire manufacturing processes and FIG. 1B illustrates detailed processes of process 110 of FIG. 1 in accordance with some embodiments. The embodiment described in the following can be easily understood by alternatively refer to the processes in the flow chart shown in FIG. 1A and FIG. 1B as well as the cross sectional views of structures of semiconductor devices in FIG. 2 through FIG. 8.

Figure 2:
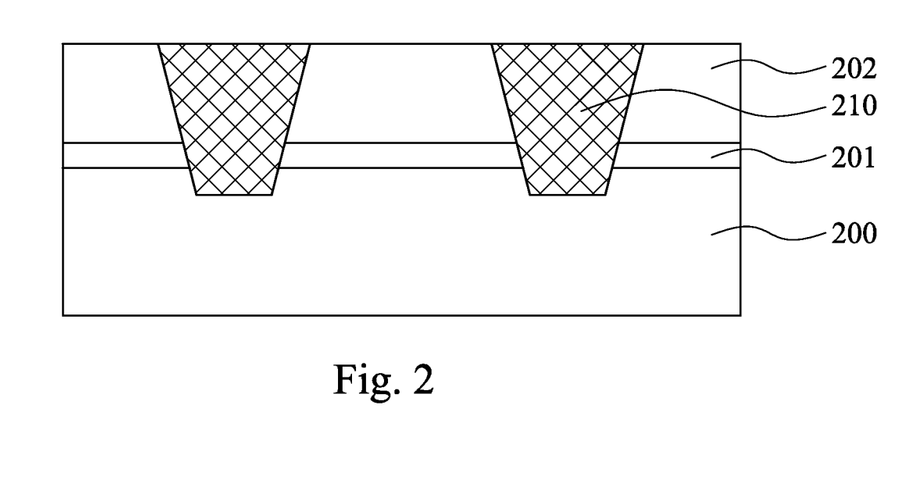
FIG. 2 through FIG. 8 are various cross sectional views of structures at different stages of a continuous manufacturing processes in accordance with the embodiments.
Figure 3:
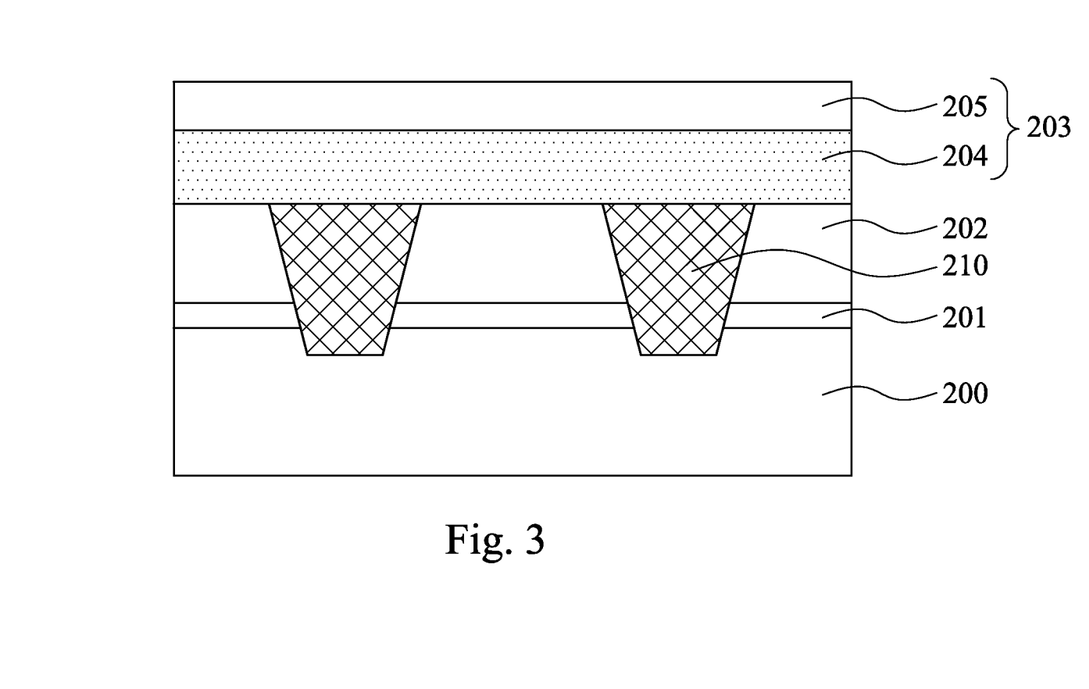
Figure 4:
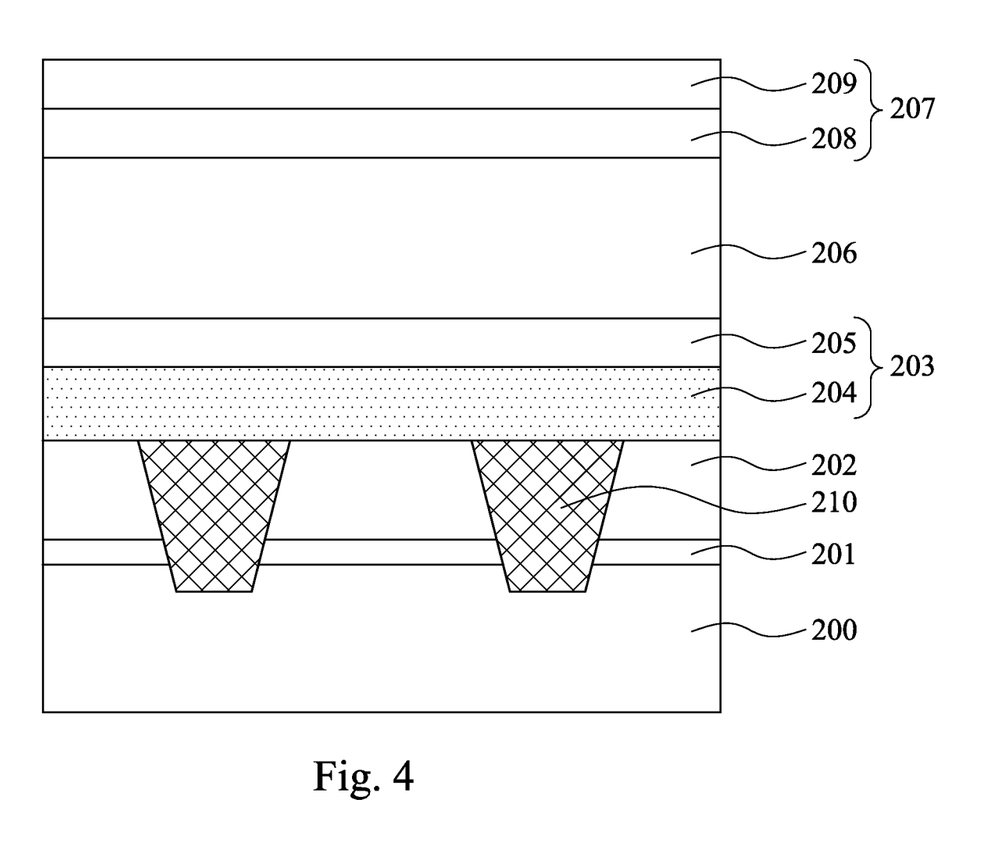
Figure 5:
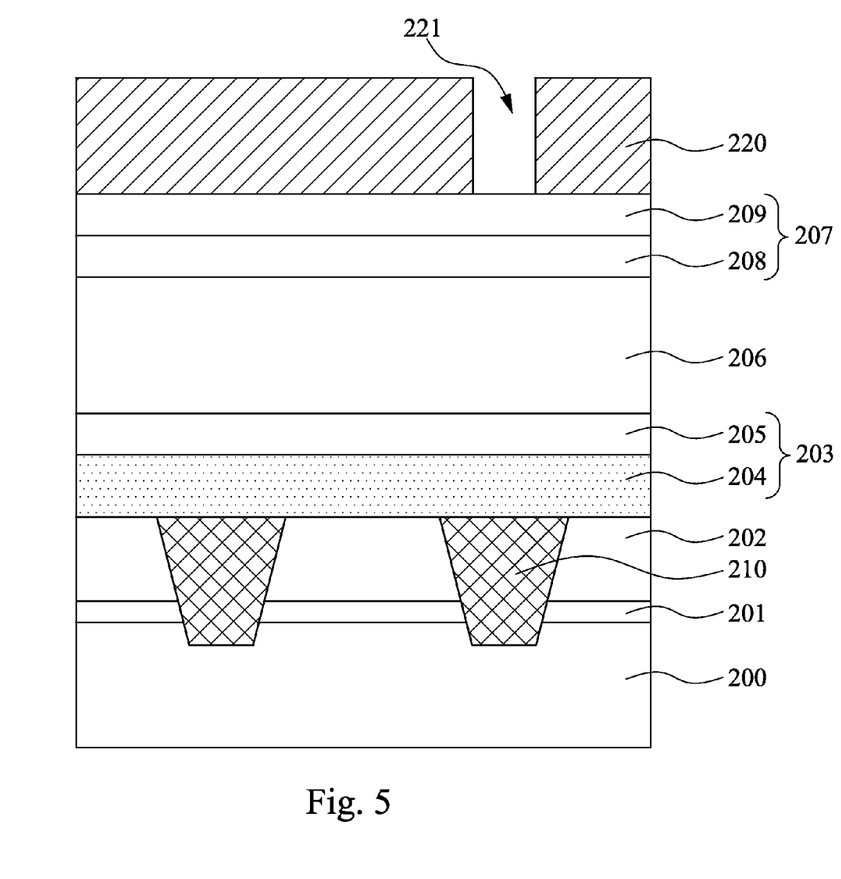
Figure 6:
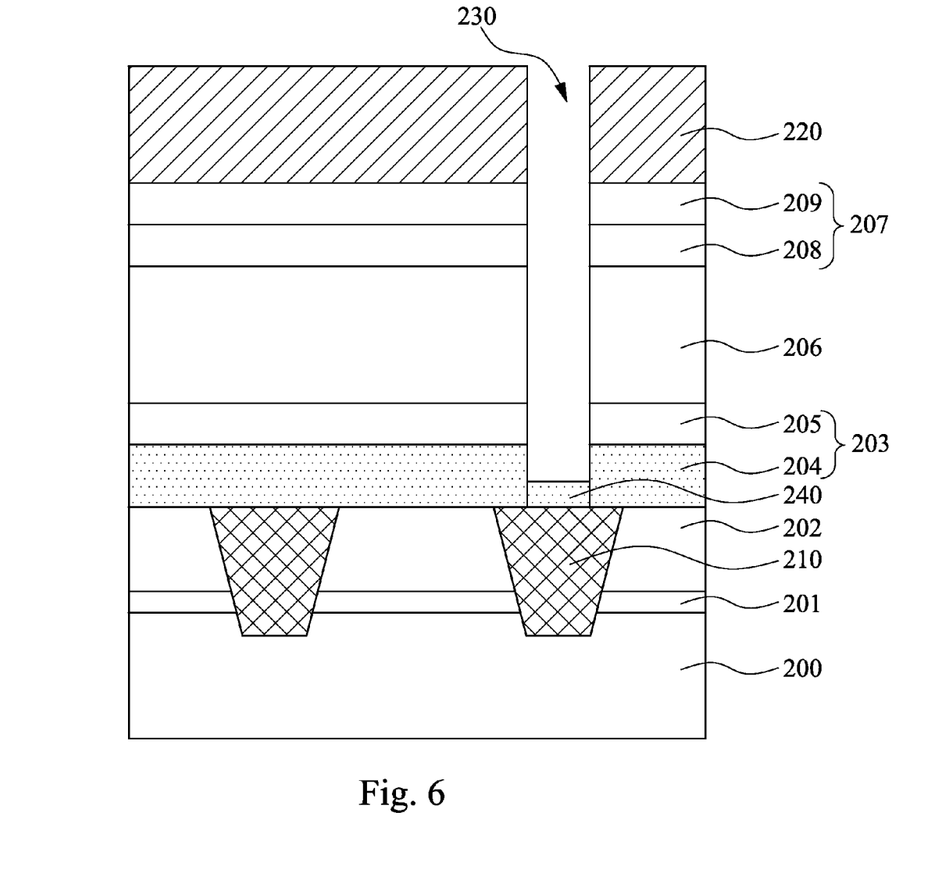
Figure 7:
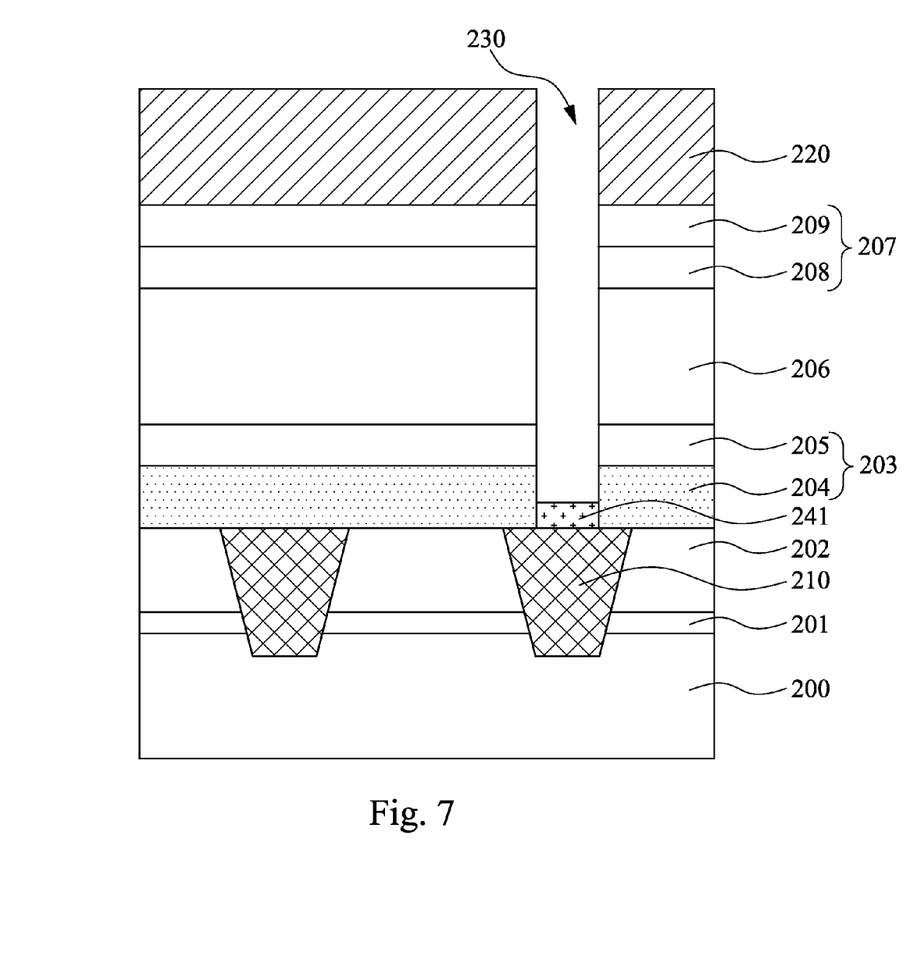
Figure 8:
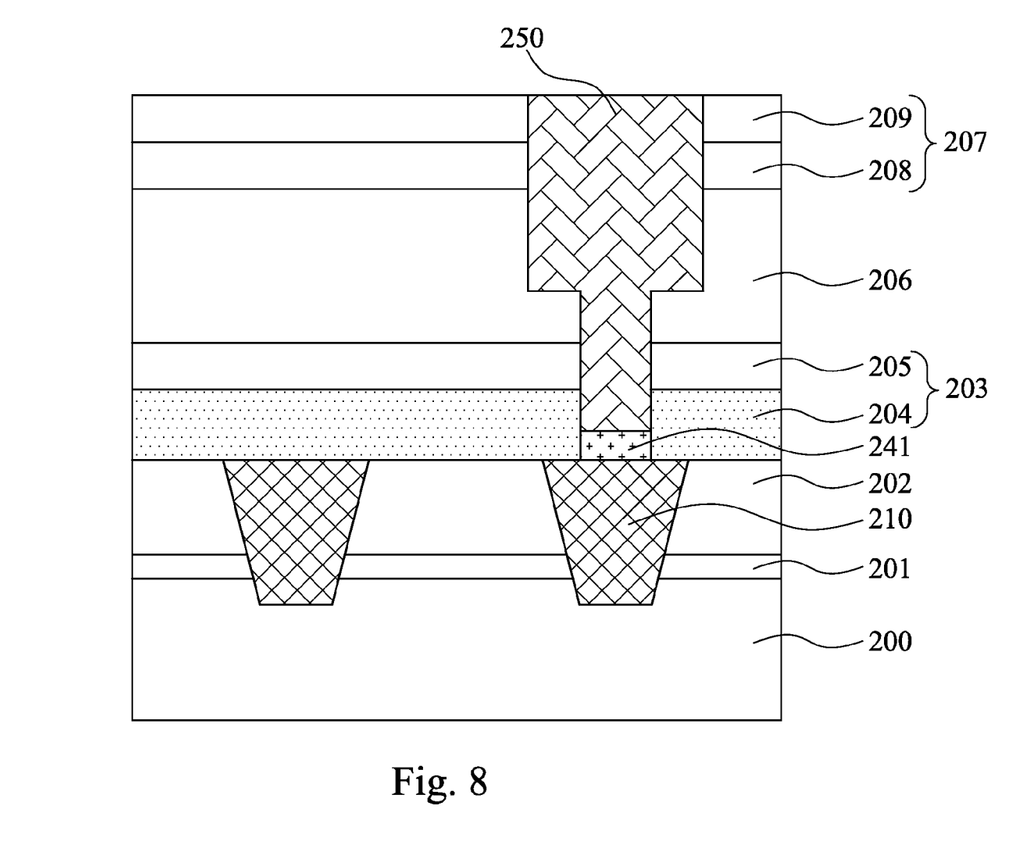
Figure 9:
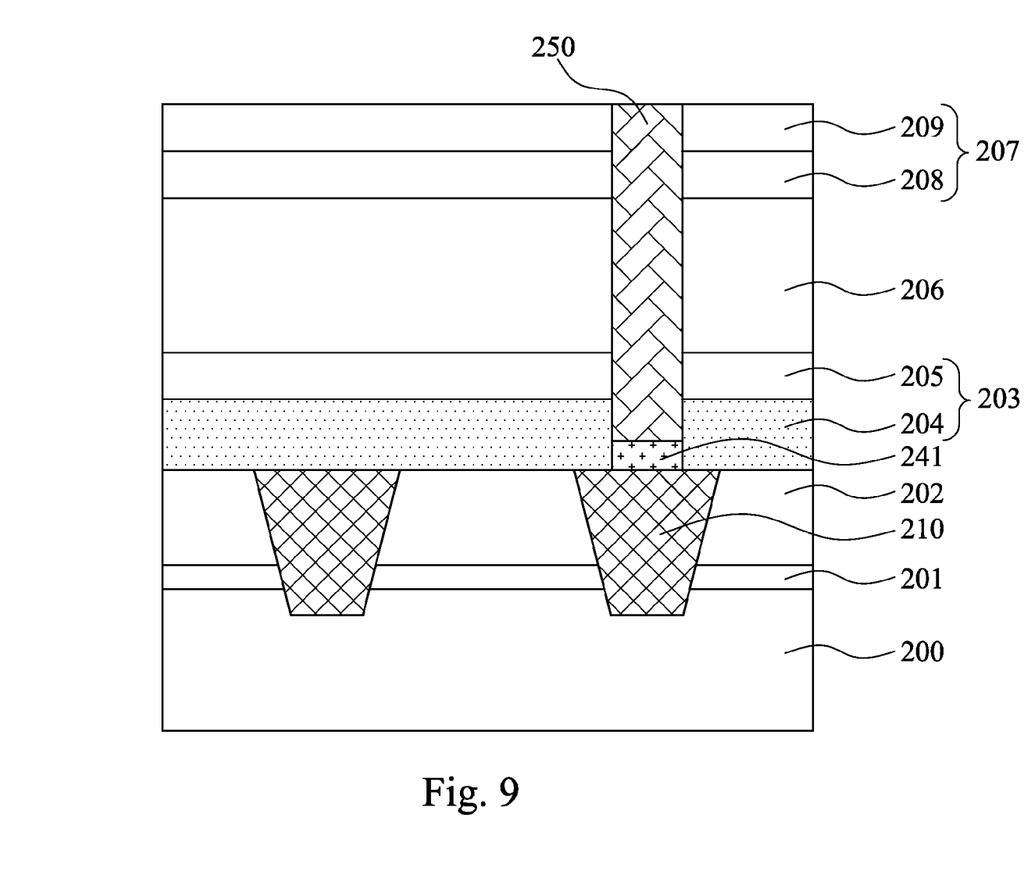
FIG. 9 illustrates a cross sectional view of structure of a semiconductor device in accordance with other embodiments.

FIG. 2 through FIG. 7 are various cross sectional views of structures at different stages of a continuous manufacturing process according to the embodiment. Among the figures, FIG. 2 through FIG. 4 illustrate the cross sectional views of structures of a semiconductor device manufactured by process 110 of FIG. 1A, while FIG. 5 through FIG. 7 illustrate the cross sectional views of structures of a semiconductor device particularly related to the formation of a metal-doped etch stop layer according to process 120 through process 140 of FIG. 1A. FIG. 8 and FIG. 9 relate to structures of an interconnect formed on the metal-doped etch stop layer after the metal-doped etch stop layer is formed.

Referring to FIG. 2, which shows a cross sectional view of a structure of a semiconductor device at a stage of forming a semiconductor device (e.g., process 110 of FIG. 1A). A portion of a semiconductor device having an underlying structure 200, a barrier layer 201, a first dielectric layer 202, and a conductor 210 is manufactured. The conductor 210 through the first dielectric layer 202 and the barrier layer 201 directly contact the underlying structure 200. In some embodiments, the underlying structure 200 is typically a semiconductor substrate with a variety of pre-metal layers deposited or formed thereon separated by individual dielectric layers. For example, the underling structure 200 can be a silicon substrate with active features thereon. The active features comprise, for example, one or more polysilicon layers, field isolation oxides, gate oxides, silicon nitride layers, as well as metallization layers. For simplicity, these structures and other pre-metal layers are represented as the underlying structure 200 in FIG. 2.

Referring to FIG. 2, which shows a cross sectional view of a structure of a semiconductor device at a stage of forming a semiconductor device (e.g., process 110 of FIG. 1A). To form the underlying structure 200 (e.g., process 111 of FIG. 1B) in according with the embodiments, an extremely pure single crystal silicon wafer is first exposed to high temperature vapor to form a layer of silicon oxide thereon. Then a silicon nitride layer is deposited on the surface by chemical vapor deposition (CVD) of reactive gases such as saline and ammonia. It is noticed that other deposition process such as, atmospheric pressure CVD (APCVD), low pressure CVD (LPCVD), plasma enhanced CVD (PECVD), metal-organic CVD (MOCVD), physical vapor deposition (PVD), atomic layer deposition (ALD), chemical solution deposition, sputtering, and a combination thereof, can be used. The structure is then coated with a photo resist layer, patterned by lithography, and etched via a dry etch process to form a shallow trench isolation (STI) structure. After depositing silicon oxide or dielectric material into the shallow trench isolation and removing the silicon nitride layer, a metal gate is deposited on the surface. Examples of the material of the metal gate can be tungsten (W), titanium (Ti), tantalum (Ta), aluminum (Al), nickel (Ni), ruthenium (Ru), palladium (Pd), platinum (Pt), tungsten nitride (WNx), titanium nitride (TiN), tantalum nitride (TaN), aluminum nitride (AlN), tungsten silicide (WSix), nickel silicide ($Ni_2Si$), titanium silicide ($TiSi_2$), titanium aluminide (TiAl), an alloy thereof, and a combination thereof. In the embodiment, poly silicon glass is used as the material of the metal gate. The poly silicon gate layer is deposited on the surface by chemical vapor deposition (CVD) of reactive gases such as saline and nitrogen. The poly silicon layer under lithography process and etching process form a poly silicon gate thereafter. Finally, phosphorus and boron ions are implanted into the wafer to form source/drain regions, wherein the source/drain region may comprises light doped drain (LDD) region. The underlying structure 200 comprising multiple structures and layers prior to a metal layer is simply represented in FIG. 2 as a single layer.

Referring to FIG. 2, which shows a cross sectional view of a structure of a semiconductor device at a stage of forming a semiconductor device (e.g., process 110 of FIG. 1A). The barrier layer 201 of silicon carbide is deposited on the underlying structure 200 (e.g., process 112 of FIG. 1B) according to the embodiments. The barrier layer 201 is formed by a deposition process such as, for example, chemical vapor deposition (CVD), physical vapor deposition (PVD), and a combination thereof. The barrier layer 201 is used as an etch stop layer or a hard mask during plasma etching processes to protect the underlying structure 201. Additionally, the barrier layer 201 of amorphous silicon carbide provides an excellent prevention of a diffusion of a low resistance metal conductor into a dielectric layer. Thus a chemical reaction between a metal ion and an ion of a dielectric layer can be avoided to increase a structure stability and electrical performance of a semiconductor device.

Referring to FIG. 2, which shows a cross sectional view of a structure of a semiconductor device at a stage of forming a semiconductor device (e.g., process 110 of FIG. 1A). The first dielectric layer 202 is deposited on the barrier layer 201 by a deposition process according to the embodiments (e.g., process 113 of FIG. 1B), such as chemical vapor deposition (CVD). The first dielectric layer 202 is an extreme low k layer and functions as a spacer and a dielectric filter to reduce a parasitic capacitance between two conductive elements therein. As used herein, the term "extreme low K" refers to the material having a dielectric constant, k, far lower than 3.9, which is the k value of $SiO_2$. The material of the first dielectric layer can be carbon-containing dielectric materials, and may further contain nitrogen, hydrogen, oxygen, and combinations thereof. Examples of the material of the first dielectric layer include but are not limited to nitrogen-doped silicon carbide, aluminum nitride, aluminum oxide, silicon-rich nitride. It is noticed that, a single barrier layer 201 and a single first dielectric layer are illustrated in the embodiment and shown in the figures. However, a plurality of barrier layers and dielectric layers may deposited alternatively over a poly silicon gate layer in the underlying structure in reality.

Referring to FIG. 2, which shows a cross sectional view of a structure of a semiconductor device at a stage of forming a semiconductor device (e.g., process 110 of FIG. 1A). The conductor 210 is formed in a trench structure or a through hole through the first dielectric layer 202 and the barrier layer 201 by a single damascene metallization process or a dual damascene metallization process (e.g., process 114 of FIG. 1B). The conductor 210 is directly connected to the poly silicon gate in the underlying structure 200. Functionally, the conductor 210 can be, for example, a conductive plug, a gate of a metal oxide semiconductor field effect transistor (MOSFET) or a thin film transistor (TFT), bases or emitters of a bipolar complementary metal oxide semiconductor (BCMOS) device, or a part of a metal layer of a multi-layer interconnect structure. Additionally, the material of the conductor 210 can be one selected from a group consisting of, for example, aluminum, copper, and tungsten. In the embodiment, the conductor 210 is made of copper. The conductor 210 is used as a metal line electrically connected to the poly silicon gate in the underlying structure 200 to input or output a signal.

Referring to FIG. 3, which shows a cross sectional view of a structure of a semiconductor device at a stage of forming a semiconductor device (e.g., process 110 of FIG. 1A). A composite etch stop layer 203 includes a lower etch stop layer (LESL) 204 over the first dielectric layer 202 and the conductor 210 and an upper etch stop layer (UESL) 205 over the lower etch stop layer (LESL) 204 is formed on the dielectric layer 202 (e.g., process 115 of FIG. 1B) according to the embodiments. The lower etch stop layer (LESL) 204 is deposited or formed of, for example but are not limited to, aluminum nitride, aluminum oxide, silicon-rich nitride, and nitrogen-doped silicon carbide, while the upper etch stop layer (UESL) 205 is formed of tetra-ethyl-ortho-silicate (TEOS) oxide by a process comprising chemical vapor deposition (CVD), physical vapor deposition (PVD), and a combination thereof. When using a chemical vapor deposition process, the reaction gases depend on the material and composition of the upper etch stop layer (UESL) 205 and lower etch stop layer (LESL) 204 independently. In the embodiment, the lower etch stop layer (LESL) 204 of nitrogen-doped silicon carbide is deposited by the chemical vapor deposition (CVD) process using gases may including $Si(CH_3)_4$, $Si(CH_3)_3H$, $CO_2$, Xe, $O_2$, and $N_2$; while the upper etch stop layer (UESL) 205 of tetra-ethyl-ortho-silicate (TEOS) is formed by the chemical vapor deposition process using precursors including methyldiethoxysilane (mDEOS). The composite etch stop layer 203 is used to accurately control the formation of the damascene opening during an etching process in a single damascene process or a dual damascene process depending on the number of underlying dielectric layers. Furthermore, the upper etch stop layer (UESL) 205 is composed of a nitrogen-free material, hence the adverse effects of photo resist poison is substantially eliminated because the upper etch stop layer (UESL) 205 protects a nitrogen in the lower etch stop layer (LESL) 204 from being released to a photo resist layer (not shown).

Referring to FIG. 4 which shows a cross sectional view of a structure of a semiconductor device at a stage of forming a semiconductor device (e.g., process 110 of FIG. 1A). Three layers including a second dielectric layer 206, and a composite anti-reflective layer 207, which are formed or deposited on the upper etch stop layer (UESL) 205. The anti-reflective layer is composed of a T3 layer 208, and a nitrogen-free reflective layer 209. The second dielectric layer 206 is deposited on the upper etch stop layer (UESL) 205 (e.g., process 116 of FIG. 1B) according to the embodiments, by a chemical vapor deposition (CVD) process using the same reactive gases such as, for example but are not limited to, aluminum nitride, aluminum oxide, and silicon-rich nitride. The second dielectric layer 206 can be formed by a process similar to a process of forming the first dielectric layer 202. In the embodiment, the first dielectric layer is formed by a chemical vapor deposition (CVD) process. The material of the second dielectric layer 206 can be as same as the material of the first dielectric layer 202, or another material with extreme low k constant. Functioning as the same as the first dielectric layer 202, the second dielectric layer 206 is used for reducing a parasitic capacitance between two conductive elements. In the embodiment, the material of the second dielectric layer 206 is as same as the material of the first dielectric layer 202, and the second dielectric layer 206 functions as a spacer to reduce a parasitic capacitance between interconnects therein. Additionally, the second dielectric layer 206 will be etched to form a via hole therein in the following embodiments.

Referring to FIG. 4, which shows a cross sectional view of a structure of a semiconductor device at a stage of forming a semiconductor device (e.g., process 110 of FIG. 1A). During the processes afterward using conventional lithographic techniques, many of layers in a semiconductor device are reflective to ultraviolet light. The reflection reflected from the layers causes distortion of the dimensions of features, namely, via openings are more easily formed in an energy sensitive resist material. Hence, an anti-reflective layer coated on the semiconductor device is necessary to help reduce reflections off an underlying material, standing waves, thin-film interference, and specular reflections prior to patterning. The composite anti-reflective layer 207 composed of the T3 layer 208 and the nitrogen-free anti-reflective layer 209 is formed on the second dielectric layer 206 (e.g., process 117 of FIG. 1B) according to the embodiments. Additionally, the T3 layers 208 consist of thin film structures with alternating layers of contrasting refractive index. The thickness of the T3 layer 208 is chosen to produce destructive interference in the beams reflected from the interfaces, and constructive interference in the corresponding transmitted beams. By way of example, and by no means limiting, the T3 layer 208 utilizes thin film materials such as oxides, sulfides, fluorides, nitrides, selenides, and metals. Above the T3 layer 208 the nitrogen-free anti-reflective layer 209 is formed thereafter to improve the resolution of the lithography process. The nitrogen-free anti-reflective layer 209 can prevent the nitrogen in an underlying material from releasing to the photo resist layer and hence reduces the photo resist poison. The T3 layer 208 and the nitrogen-free anti-reflective layer 209 form the composite anti-reflective layer 207 on a semiconductor device to improve lithography and patterning processes.

Referring to FIG. 5, which illustrates a cross sectional view of a structure of a semiconductor device at a stage of forming a metal-doped etch stop layer. A photo resist layer 220 is coated on the composite anti-reflective layer 207 first, followed by a patterning process accomplished by using a conventional photolithographic technique (e.g., process 120 of FIG. 1A) according to the embodiments. In the patterning process, the photo resist layer 220 is selectively exposed to an ultraviolent radiation and developed to form a resist mask having a hole 221 therein. As illustrated in FIG. 5, the hole 221 is substantially aligned with the conductor 210. Additionally, the hole 221 is, in particular but not exclusively, equal to or smaller than the aligned conductor 210. Then the hole 221 is removed by a dry etching process using plasma gas comprising fluorocarbons. In the embodiment, the hole 221 in the photo resist layer is as large as the conductor 210.

Referring to FIG. 6, which illustrates a cross sectional view of a structure of a semiconductor device at a stage of forming a metal-doped etch stop layer. A via hole 230 from the hole 221 through the second dielectric layer 206 is formed (e.g., process 130 of FIG. 1A), by an dry etching process using reactive gases such as fluorocarbons, oxygen, chlorine, boron trichloride; sometimes with addition of nitrogen, argon, helium and other gases. As illustrated in FIG. 6, wherein the via hole 230 through a stack of layers including the composite anti-reflective layer 207, the second dielectric layer 206, and the upper etch stop layer (UESL) 205, and partially expose a portion of the lower etch stop layer (LESL) 204 right above the conductor 210. The partially exposed portion of the lower etch stop layer is called an exposed portion of the etch stop layer 240 herein. Furthermore, the via hole 230, the exposed portion of the lower etch stop layer 240, and the conductor 210 are aligned with each other and form a pathway for current. In the embodiment, the exposed portion of the lower etch stop layer 240 has a recess structure, where the thickness of the exposed portion of the lower etch stop layer 240 is smaller than the surrounded lower etch stop layer (LESL) 204 surrounded, wherein the thickness of the exposed portion of the lower etch stop layer 240 is smaller than half of the original thickness. Furthermore, the via hole 230 is equal to or smaller than the underlying conductor 210 because the via hole is formed by an etching process from the hole 221 in the photo resist layer 220. Additionally, a sidewall of the exposed portion of the lower etch stop layer 240 is steep owing to an anisotropic etching process. As mentioned before in FIG. 5 (e.g., process 120 of FIG. 1A), the opening in the photo resist layer cause the exposed portion of the etch stop layer 240 is also as large as the underlying conductor 210 after an etching process in the embodiment.

Referring to FIG. 7, which illustrates a cross sectional view of a structure of a semiconductor device at a stage of forming a metal-doped etch stop layer. After the via hole 230 and the exposed portion of the lower etch stop layer 240 is formed by an dry etching process, the exposed portion of the lower etch stop layer 240 is then doped with a conductive element (e.g., process 140 of FIG. 1A). The processes used to dope a material comprise an ion implantation process and a thermal diffusion process and a combination thereof. While the conductive element can be one selected from a group consisting of but are not limited to silver (Ag), titanium (Ti), vanadium (V), nickel (Ni), copper (Cu) and a combination thereof. It is noticed that the doped conductive element has an ionic radius smaller enough to make the conductive element doped into the etch stop later. Furthermore, the doped conductive element should be a supplier of electrons after doped into the etch stop layer. In this embodiment, the exposed portion of the lower etch stop layer 240 is doped with silver ions through the via hole 230 by ion implantation process comprising cluster ion implantation, plasma doping, and laser doping technique. After the ion implantation process of silver ions, the exposed portion of the lower etch stop layer 240 over the conductor 210 is transformed into a metal-doped etch stop layer 241 as illustrated in a cross sectional view of a structure in FIG. 7.

During the silver implantation, silver ions occupy interstitial sites in a diamond structure of silicon carbide of the exposed portion of the lower etch stop layer 240. Meanwhile, the silver ions provide 3d electrons which can form hybrid orbital with Si—C covalent bonds, namely, the electric conductivity of a silver-doped silicon carbide dramatically increase. The metal-doped etch stop layer 241 doped with silver ions having an electric conductivity 10 times larger than copper oxide, can be used as a good conductive pad between two conductive elements. Additionally, the thickness of the metal-doped etch stop layer 241 can be further decrease by adjusting parameters of an etching process. Hence, the electric resistance of the metal-doped etch stop layer can be further decrease that improve the electric conductivity and overall performance. Furthermore, the metal-doped etch stop layer 241 is as large as the conductor 210 so that an effect of point at the interface between the etch stop layer 241 and the conductor 210 can be reduced when a current flows through the interface. In some embodiment, two or more conductive elements are doped into the exposed portion of the etch stop layer meanwhile or in sequence to form a metal-doped etch stop layer 241 with a higher electric conductivity or a higher mechanical strength. In other embodiments, the metal-doped etch stop layer functioning as a conductive pad can be formed at a stage of a manufacturing process of forming a semiconductor device (e.g., process 110 of FIG. 1A), to be more precisely, a step of forming an etch stop layer 203 (e.g., process 115 of FIG. 1B). For example, implant a portion of the etch stop layer 203 with a conductive ion before depositing the second dielectric layer 206 thereon.

Referring to FIG. 8 and FIG. 9, which show cross sectional views of structures of semiconductor devices with a metal-doped etch layer as well as an interconnect thereon. After the metal-doped etch stop layer is formed over the conductor, a conductive material can be filled into the via hole to form an interconnect. In the embodiment referring to FIG. 8, a layer of photo resist layer is deposited on the metal-doped etch stop following by an etching process to remove a portion of the second dielectric layer 206. The area of the removed portion of the second dielectric layer 206 has a suitable size or shape according to a design of electric elements of a semiconductor device. The removed portion of the second dielectric layer is then filled with a conductive material to form an interconnect 250. The filling process uses a single damascene metallization process in the embodiment. If double dielectric layers deposited on the composited etch stop layer 203, the filling process uses a double damascene metallization process. In another embodiment referring to FIG. 9, instead of removing a portion of the second dielectric layer, the via hole 230 is directly filled with a conductive material to form an interconnect 250. Both embodiments manufacture an interconnect 250 over the metal-doped etch stop layer 241, and a signal can be inputted or outputted through the metal-doped etch stop layer 241 having low electric resistance.

In a conventional damascene metallization process, before filling a via hole connected to a conductor with a conductive material, an etch stop layer directly connected to the conductor is entirely removing by a dry etching process. However, during the dry etching process, a metal layer of the conductor tends to react with oxygen to form a metal oxide layer having high electric resistance thereon. The metal oxide layer thus forms an electric barrier on the electric pathway connecting the conductor 210 to another conductive element, that is to say, a performance of a semiconductor device is largely decreased when a small portion of metal oxide forms between two conductive elements.

A method disclosed according to the embodiment to dissolve the problem described above of a metal oxide layer formed on the conductor during an etching process is partially etching the lower etch stop layer 204 and doping a conductive element into the exposed portion of the exposed lower etch stop layer 240 over the conductor 210 by an ion implantation process. The cross sectional view of It is noticed that a reduced thickness of the exposed portion of the lower etch stop layer 240 is beneficial to an electric conductivity, namely, decreasing the electric resistance in a direction normal to a surface of the conductor 210. Furthermore, the exported portion of the etch stop layer 240 is as large as the conductor 210 that can avoid an effect of point at the interface between the conductor 210 and the exposed portion of the etch stop layer 240. After a ion implantation process, a metal-doped etch stop layer 241 has a much higher electric conductivity than the metal oxide layer formed in the convention process as well as, needless to say, the original etch stop layer. Thus the metal-doped etch stop layer 241 can be used as a conductive pad over the conductor and connected to another conductive element such as, for example, an interconnect formed by filling a via hole with a conductive material. Furthermore, the method is more easily and controllable in manufacturing processes than the conventional processes, so the conductor device with a higher yield rate and a better electric performance can be realized.

In accordance with some embodiments of the present disclosure, a semiconductor device composed of a stack of structures including an underlying structure, a dielectric layer, a conductive plug, and an etch stop layer in sequence. The conductive plug through the dielectric layer electrically contact the underlying structure, and is coated with the etch stop layer. A part of the etch stop layer right above the conductor is doped with a conductive element.

In accordance with some embodiments of the present disclosure, a semiconductor device composed of multiple layers comprising an underlying structure, a first dielectric layer, a conductive material, a conductive pad, an etch stop layer, and a second dielectric layer. The conductive material through the first dielectric layer directly connects to the underlying structure right below and the conductive pad right above. The conductive pad is embedded in the etch stop layer between the first dielectric layer and the second dielectric layer.

In accordance with some embodiments of the present disclosure, a method of manufacturing a semiconductor device with a metal-doped etch stop layer including, first of all, forming a conventional semiconductor device consisting of multiple layers comprising an underlying structure, a first dielectric layer, a conductor, an etch stop layer, a second dielectric layer; second, coating a photo resist layer with a hole, aligned with the conductor, on the semiconductor device. Third, etching the dielectric layer right below the hole to form a via hole through the second dielectric layer to expose an exposed portion of the etch stop layer connected to the conductor. Finally, doping the exposed portion of the etch stop layer with a conductive element. Thus, a metal-doped etch stop layer is formed on the conductor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
an underlying structure;
a dielectric layer on the underlying structure;
a conductive plug through the dielectric layer and electrically connected to the underlying structure; and
an etch stop layer over the dielectric layer and the conductive plug, wherein a portion of the etch stop layer over the conductive plug is doped with a conductive element.

2. The semiconductor structure of claim 1, wherein the portion of the etch stop layer is equal to or smaller than the underlying conductive plug.

3. The semiconductor structure of claim 1, wherein the portion of the etch stop layer doped with the conductive element has a recess in the etch stop layer.

4. The semiconductor structure of claim 1, wherein the etch stop layer comprises a material selected from a group consisting of comprises Ni-doped silicon carbide, aluminum nitride, aluminum oxide, silicon-rich nitride and a combination thereof.

5. The semiconductor structure of claim 4, wherein the material is Ni-doped silicon carbide.

6. The semiconductor structure of claim 1, wherein the conductive element is a metal.

7. The semiconductor structure of claim 6, wherein the metal is selected from a group consisting of silver, titanium, vanadium, nickel, copper and a combination thereof.

8. The semiconductor structure of claim 7, wherein the metal is silver.

9. The semiconductor structure of claim 1, wherein the conductive plug material is selected from a group consisting of copper, aluminum, tungsten, and a combination thereof.

10. A semiconductor device comprising:
    an underlying structure;
    a first dielectric layer on the underlying structure and comprising a through hole filled with a conductive material;
    a conductive pad overlying and in direct contact with the conductive material;
    an etch stop layer surrounding the conductive pad; and
    a second dielectric layer on the etch stop layer.

11. The semiconductor device of claim 10, wherein the conductive pad has a thickness smaller than a thickness of the etch stop layer.

12. The semiconductor device of claim 10, wherein the conductive pad and the etch stop layer forms a trench structure.

13. The semiconductor device of claim 10, wherein the conductive pad is equal to or smaller than the conductive material.

14. The semiconductor device of claim 10, wherein the conductive pad contains a material selected from a group consisting metal, ceramic, polymer, and a combination thereof.

15. The semiconductor device of claim 14, wherein the material is silver.

16. A method of forming a semiconductor structure, the method comprising:
    forming an interconnect structure that has a dielectric layer and a conductor therein, and an etch stop layer over the dielectric layer;
    applying a photo resist layer and patterning the photo resist layer to expose a portion of the etch stop layer on the a top surface of the conductor over of the dielectric layer; and
    doping the exposed portion of the etch stop layer with an element.

17. The method of claim 16, furthering comprising removing a thickness of the etch stop layer on the top surface of the conductor after exposing the portion of the etch stop layer.

18. The method of claim 16, wherein doping the exposed portion of the etch stop layer is performed by a process selected from a group consisting of an ion implantation process, a thermal diffusion process, and a combination thereof.

19. The method of claim 16, wherein doping the exposed portion of the etch stop layer is performed by doping the exposed portion of the etch stop layer with a conductive element.

20. The method of claim 18, wherein doping the exposed portion of the etch stop layer with a conductive element.

\* \* \* \* \*